United States Patent [19]

Kuo et al.

[11] Patent Number: 4,791,313

[45] Date of Patent: Dec. 13, 1988

[54] BIPOLAR TRANSISTOR SWITCHING ENHANCEMENT CIRCUIT

[75] Inventors: James R. Kuo, Cupertino; Brian R. Carey; Timothy G. Moran, both of Sunnyvale, all of Calif.

[73] Assignee: Fairchild Semiconductor Corp., Cupertino, Calif.

[21] Appl. No.: 930,608

[22] Filed: Nov. 13, 1986

[51] Int. Cl.[4] .................. H03K 5/01; H03K 17/04
[52] U.S. Cl. .................................... 307/268; 307/270; 307/255; 307/241; 307/296 R; 330/156
[58] Field of Search ............... 307/276, 263, 578, 254, 307/482, 296 R, 268; 330/156

[56] References Cited

U.S. PATENT DOCUMENTS

| | | | |
|---|---|---|---|
| 4,176,289 | 11/1979 | Leach et al. | 307/578 |
| 4,191,899 | 3/1980 | Tomczak et al. | 307/270 |
| 4,251,742 | 2/1981 | Beelitz | 307/270 |
| 4,484,147 | 11/1984 | Metz | 330/156 |
| 4,609,832 | 9/1986 | Mehl | 307/570 |

*Primary Examiner*—John S. Heyman
*Attorney, Agent, or Firm*—Lee Patch; Gary Aka; James A. Deland

[57] ABSTRACT

A line driver circuit capable of operating at high speeds. The output transistor, an emitter connected to an output terminal, has a special feedback capacitor connected to its base. The feedback capacitor helps pull the output terminal high to increase the switching speed of the line driver circuit. Special current injection and removal techniques are used to speed the switching times of the PNP current supply transistors. The line driver circuit also has special circuitry to limit the output current from exceeding certain limits and for keeping the line driver circuit from overheating.

17 Claims, 8 Drawing Sheets

DRIVER SECTION
FIG._3A.

FIG._3B.

REFERENCE CURRENT SOURCE BLOCK
FIG._3C.

THERMAL SHUTDOWN CIRCUIT
FIG._5B.

FIG._6A. CURRENT LIMITER SECTION

FIG._6B. HYSTERESIS AMPLIFIER

EDGE PULSE GENERATOR BLOCK
FIG._6C.

FIG._6D.

VOLTAGE TO BASE OF Q93

VOLTAGE TO BASE OF Q94

VOLTAGE TO BASE OF Q95

VOLTAGE TO BASE OF Q92

FIG._6E.

BIPOLAR TRANSISTOR SWITCHING ENHANCEMENT CIRCUIT

FIELD OF THE INVENTION

The present invention is related to bipolar digital logic circuits and, more particularly, to bipolar integrated circuits which drive digital signals over signal lines.

BACKGROUND OF THE INVENTION

In a digital logic circuit a desirable operating characteristic is a high switching speed from one logic state to another. However, other requirements, such as power dissipation, may constrain high speed designs. Digital signal transmission imposes such constraints; however, high transmission rate requires high switching speeds for the logic circuits transmitting and receiving the logic signals.

One type of data transmission is differential data transmission in which the difference in voltage levels between two signal lines form the transmitted signal. Differential data transmission is commonly used for data transmission rates greater than 100 kilobaud over long distances. Noise signals shift the ground level voltage and appear as common mode voltages. Thus, the deleterious effects of noise are substantially reduced.

To standardize such data transmission, various standards have been promulgated. These standards raise problems which must be overcome.

For example, one such standard is the recommended standard 422, RS422, which is defined by the Electronics Industry of America, EIA. This standard permits data rates up to 10 million baud over a twisted pair of signal lines. Driver circuits, i.e., circuits which place signals on the lines, must be capable of transmitting a minimum differential signal of two volts on the twisted pair line which terminates in 100 ohms resistance.

This requirement places a difficult constraint on the driver circuit where the circuit is powered by a voltage supply fairly close to ground, such as +5 volts, a commonly used voltage supply for integrated circuits. The driver circuit must switch in a 2-volt swing within the 5-volt differential between the voltage supply and ground. The switching speed of the driver circuit must remain high to permit a high rate of data transmission and the circuit must be able to handle the larger currents to drive the digital signals onto the signal lines.

Another problem with RS422 is that the twisted line pair is often used as a bus to which multiple drivers, sources of signal, are attached. When multiple drivers are connected to a common bus, only one driver may transmit data at a time. The remaining drivers should be in a high impedance state so as not to load the bus. Since large positive and negative common mode signals may appear at the driver output terminals connected to a bus system, the maintenance of a high impedance over a wide common mode voltage range and independent, whether the driver is powered or not, is desirable.

Still another problem is the possibility of excessive currents through the driver circuit. When multiple driver circuits are connected to a bus, the different driver circuits may be grounded at a different voltage levels. This produces a differential in the common mode voltage at the output terminals of the driver circuits if more than one of these circuits try to communicate over the bus at one time. The voltage differential produces a D.C. current through the driver circuit. Unless the current is limited in some way, the D.C. current may raise the temperature of the circuit so high that the driver circuit is damaged, a common danger for integrated circuits.

Furthermore, undesired heat may be produced by common mode voltage differentials, heat may also be produced in other ways. The driver circuit should be protected from excessive heat.

SUMMARY OF THE INVENTION

The present invention solves or substantially mitigates these problems. The present invention provides for a bipolar integrated circuit line driver which operates with a single +5 voltage supply and ground. The swing in voltage is large relative to this 5-volt difference and a high switching speed is maintained.

These high switching speeds are achieved by a feedback capacitor which is coupled between a base terminal of an output transistor and a base terminal of a second transistor having an emitter terminal connected to the base terminal of the output transistor. Charge stored on the capacitor helps pull an output terminal connected to an emitter terminal of the output transistor high very quickly as the output transistor is turned on.

High switching speeds are also achieved by techniques to speed up the turn-on and turn-off times of PNP transistors used as current sources for the output transistor. A feedback capacitor technique is used for transient current surges to and from the base regions of the PNP transistors. An alternative transistor current overdrive technique is also used to turn on PNP transistors.

Such momentary current surges are also used to turn off NPN transistors.

Furthermore, the present invention provides for a high impedance output over a common mode voltage range from −7 volts to +12 volts whether power is off or on. This is achieved without any appreciable sacrifice in speed; the driver circuit has a maximum delay time of only 20 nanoseconds. Rise and fall time are less than 20 nanoseconds and data transmission rates of greater than 10 megabaud.

Additionally, the present invention has current limiting circuitry which protect the circuit from common mode voltage differentials and from overheating. One of two current sources to the output transistor is controlled by current limiter circuitry, which is responsive to current through the output transistor and the temperature of the line driver circuitry. The current limiter circuitry turns off the current source in response to an excessive output current or excessive temperature. Special techniques are used to avoid oscillation with respect to the output current and temperature.

DESCRIPTION OF THE DRAWINGS

The present invention can be understood by a perusal of the description below and reference to the following drawings.

DETAILED DESCRIPTION OF THE INVENTION

Figure 1:
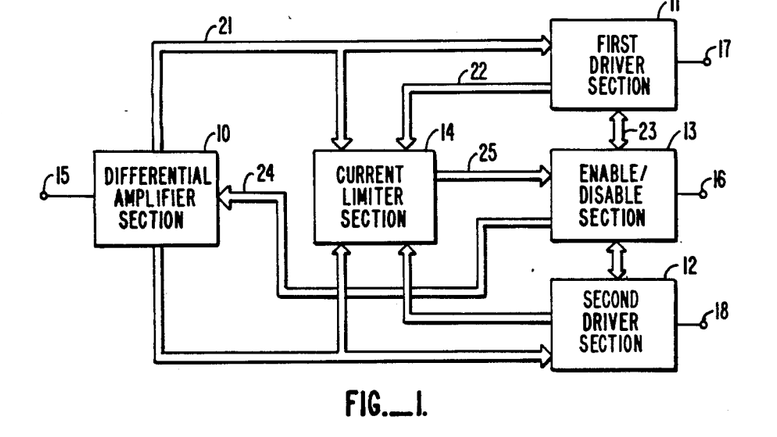
FIG. 1 is a general circuit diagram of the present invention divided into various sections.

FIG. 1 illustrates the general organization of the line driver circuit of the present invention. The division of the present line driver circuit into various parts is used to aid the understanding of the various features of the present invention. However, it should be noted that the division of the line driver circuit into different parts is somewhat arbitrary; in many cases it is difficult to separate a particular element into one division or another.

The general operation of the line driver circuit of the present invention is to transmit a digital signal at the input terminal 15 into true and complementary signals at the output terminals 17, 18. The difference in voltage between the signals on the output terminals 17, 18 form the differential signals.

The present invention has a differential amplifier section 10 which generates true and complementary signals from the data signal received at the input terminal 15. The signals from the differential amplifier section 10 are sent to a first driver section 11 by a signal path 21. The first driver section 11 generates one set of signals at the output terminal 17 in a suitable condition to be placed on the signal line to which the output terminal is to be connected; i.e., the driver section 11 "drives" the output signal on the signal line.

In a similar fashion a second driver section 12 receives the complementary signals from the differential amplifier section 10 for the transmission of the complementary set of signals through the output terminal 18.

Another part of the present invention is an enable/disable section 13 which turn the driver sections 11, 12 off and on. The section 13 is controlled by an enable/disable signal received by an input terminal 16. To permit high data transmission rates the enable/disable section 13 turns the driver sections 11, 12 off and on extremely quickly. Communication between the driver sections 11, 12 and section 13 pass over a signal path 23. Since the second driver section 12 is the same and is connected in the same manner as the driver section 11, the signal paths between the second driver section 12 and enable/disable section 13 and other sections of the line driver circuit) are not labeled.

A current limiter section 14 is responsive to signals from the differential amplifier section 10 and the first and second driver sections 11, 12 over signal paths 21, 22. The current limiter section 14 serves to limit the currents through the output terminals 17, 18 and through the driver sections 11, 12. This prevents the driver circuit of the present invention from overheating and possible destruction.

Differential Amplifier Section

Figure 2:
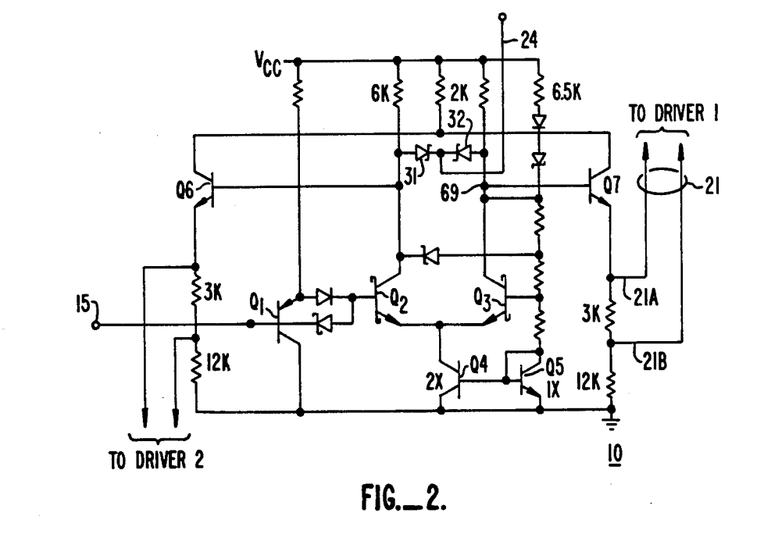
FIG. 2 is a circuit diagram of the differential amplifier section of the present invention.

Referring to FIG. 2, it can be seen that the differential amplifier section 11 has a pair of emitter-coupled Schottky transistors Q2, Q3. Both emitter terminals are connected to a current source (or, more specifically, current sink), transistor Q4. The data signal on terminal 15 turns the transistor Q1 off and on to shunt the current through the transistor Q4 through the transistor Q2 or Q3. When the data signal is high, or logic "1", the voltage to the base of the Schottky transistor Q2 is high, turning the transistor on. The transistor Q3, on the other hand, is off, thereby making the base of the transistor Q7 high, thereby turning that transistor on. Thus the signal on lines 21A, 21B forming the signal path 21 is high. The signal from the transistor Q6 to the second driver section 12, is low, on the other hand.

A low, or logic "0", signal on the data input terminal 15 generates opposite signals to the driver sections 11, 12.

To speed the switching times of the amplifier section 10, many transistors, such as Q2 and Q3 as indicated in the drawings, are so-called Schottky transistors. Such a transistor has a Schottky diode across its base-collector junction to prevent the transistor from fully saturating when it is turned on. This lowers the turn-off time of the transistor. Schottky transistors are placed in other parts of the driver circuit, besides the differential amplifier 10, for quick switching times.

It should be noted that collector terminals of both transistors Q2, Q3 are connected to a line 24 from the enable/disable section 13. Signals on the line 24 speeds the turn off of NPN transistors in the driver sections 11, 12. This operation is discussed later.

Driver Section

Figure 3A:
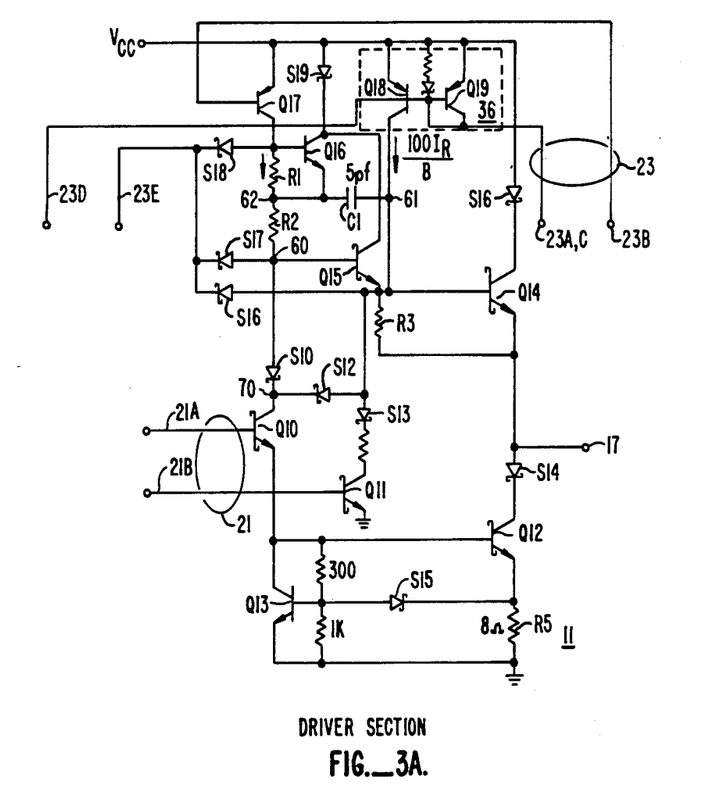
FIG. 3A is a circuit diagram of the driver section of the present invention.

Each of the driver sections 11, 12 is illustrated by FIG. 3A, which shows the particular details of driver section 11. A transistor Q14 is an output transistor for the output terminal 17 connected to an emitter terminal of the transistor Q14. When it is turned on, the transistor Q14 pulls the voltage on a signal line connected to the output terminal 17 high, or logic "1". The transistor Q14 is also large enough to handle the output current to the signal line. Transistors Q15, Q16 help the output transistor Q14 turn on, as explained below. PNP transistors Q17–Q19 are current source transistors for the driver section 11. The transistors Q18, Q19 symbolically represent a more complicated reference current source block 36 detailed in FIG. 3C. The NPN transistors Q10–Q12, responsive to signals on the lines 21A, B from the amplifier 10 switch the logic state of the driver sesction 11 from one state to another.

Each of the lines 21A, B from the differential amplifier section 10 is respectively connected to the base terminals of the transistors Q10, Q11 of the driver section 11. The emitter terminal of the transistor Q10 is connected to the base terminal of the transistor Q12. The collector terminal connects the transistor Q10 to the transistors Q14–Q16 and the PNP current source transistors Q17–Q19 through a pair of Schottky diodes S10, S12.

The transistor Q12 is a second output transistor. Through a Schottky diode S14 the collector terminal of the transistor Q12 is connected to the output terminal 17; its emitter terminal is connected to ground through a resistor R5.

The collector terminal of the transistor Q10 is connected to a collector terminal of the PNP current source transistor Q17 through the Schottky diode S10, and impedance means in the form of two resistors R2, R1. On the other hand, the current source transistor Q18 has its collector terminal connected to the base terminal of the output transistor Q14. That transistor has its collector terminal connected to the $V_{CC}$ voltage supply through a Schottky diode S16.

The other transistors Q15, Q16 and a capacitor C1 help speed the turn-on of the output transistor Q14. The emitter terminal of the transistor Q15 is connected to the base terminal of the transistor Q14 and the collector terminal of the transistor Q15 is connected by a Schottky diode S19 to the $V_{CC}$ supply voltage. The base terminal of the transistor Q15 is connected to a node 60 between the Schottky diode S10 and the resistor R2.

The transistor Q16 has its collector terminal connected in parallel with the collector terminal of the transistor Q15; the base terminal of the transistor Q16 is connected to the collector terminal of the PNP transistor Q17 and the emitter terminal to a node 62 between the resistors R1, R2.

The capacitor C1 has one terminal connected to the base terminal of the output transistor Q14. The other terminal of the capacitor C1 is connected to the node 62.

When the differential amplifier section 10 generates a high signal on the lines 21A, 21B, the transistors Q10-Q12 are turned on. Current is shunted away from the NPN transistors Q14-Q16, which remain off. With transistor Q10 on, current from the current supply PNP transistor Q17 is sent to the base terminal of transistor Q12, turning transistor Q12 on, and then to ground through the transistor Q13. Similarly, with the transistor Q11 on, current from the current source transistor Q18 is directed to ground.

With the second output transistor Q12 on, the output terminal 17 is coupled through a Schottky diode S14 to ground. A low logic signal results at the output terminal 17.

On the other hand, when the data input signal to the input terminal 15 is low, the signals from the differential amplifier 10 to the driver section 11 are low. These low voltages turn off the transistors Q10-Q12 and current begins to flow into the base regions of the transistors Q14-Q16 to turn them on. The output transistor Q14 turns on to raise the voltage on the output terminal 17 to a high, logic "1" level. The driver section 11 is designed so that the voltage on the output terminal is raised very quickly. However, this desired result occurs within the constraint of operation between +5 and 0 (ground) volts.

With the transistors Q10-Q12 off, the output terminal 17 is coupled to the emitter terminal of the transistor Q14, which is now on. The current from the PNP transistor Q18 flows into the base terminal of the output transistor Q14. Since the output transistor Q14 is on, the voltage on the output terminal 17 is high or a logic "1".

In the operation of turning the transistor Q14 on the raising the voltage on the output terminal 17, the capacitor C1 comes into play. The capacitor C1 is connected in feedback fashion to pull the node 62 high so that the transistors Q15 and Q14 are turned on quickly. The high voltage on the node 62 also pulls the output terminal 17 high through the base-emitter junctions of the transistor Q14, Q15. (Without the action of the capacitor C1, voltage on the output terminal will rise more slowly exponentially.)

When the transistors Q10-Q12 are on, charge accumulates on the feedback capacitor C1 such that the node 62 is at a higher voltage than the emitter terminal of the transistor Q15. As the transistor Q14 begins to turn on, the base terminal voltage of the transistor Q14 rises so that the voltage at the node 62 correspondingly rises. With the node 62 high and its emitter terminal high, the transistor Q16 turns off to present a high impedance barrier to the current from the capacitor C1. The current flows through the resistor R2. The rise in voltage on node 62 also pulls the resistor R2 high so that the current through the resistor R2 charges the node 60, as well as the base terminal of the transistor Q15.

The transistor Q15, in turn, drives the current from its emitter terminal into the base terminal of transistor Q14 further turning on that transistor. The voltage at the output terminal 17 rises quickly until a maximum voltage is reached. At this point the voltage at the node 62 begins to fall exponentially. Once the transistor Q14 is fully turned on and a stable state is reached, the transistor Q15 is off. Its base-emitter junction is now reverse-biased.

R2 is 2.6 kilohms while R1 is approximately 30 kilohms. R2 has that selected resistance so that it does not create too large an RC time constant for the current discharging from the capacitor C1 to the node 60; however, R2 is large enough to avoid excessive current and power dissipation. R1, on the other hand, creates the high impedance to the current from this capacitor C1 when the transistor Q16 is turned off.

Figure 3B:
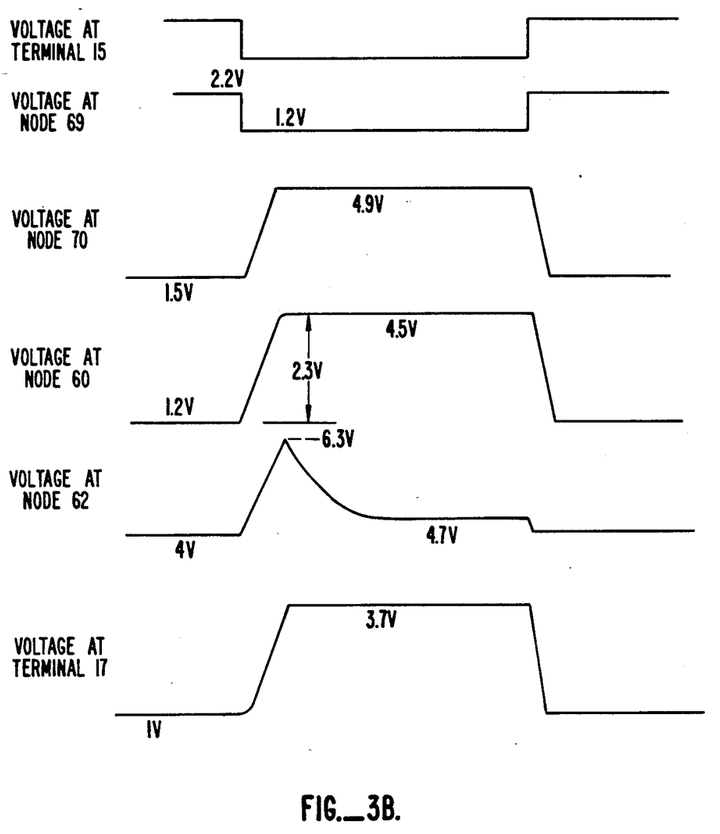
FIG. 3B illustrates the voltage signals at various points of the driver section as data is transmitted.

FIG. 3B illustrates the changes in voltages at various points, or nodes, from the input signal to the differential amplifier section 10 on through to the output signal of the driver section 11 shown in FIG. 3A. In the differential amplifier section 10 (FIG. 2), the node 69 is connected to the transistor Q3 collector terminal and the base terminal of the transistor Q7. The node 70 is connected to the transistor Q10 collector terminal in the driver section 11 (FIG. 3A). The node 60 leads to the base terminal of the transistor Q15, while the node 62 lies between the resistors R1 and R2. The voltages shown are for this particular embodiment of the invention. What is especially of note is that the voltage at node 62 reaches +6.3 volts, more than 1.3 volts higher than the supply voltage. This, in turn, as explained previously, quickly raises the voltage at the output terminal 17 through the base-emitter voltage drops of the transistors Q15 and Q14.

Figure 3C:
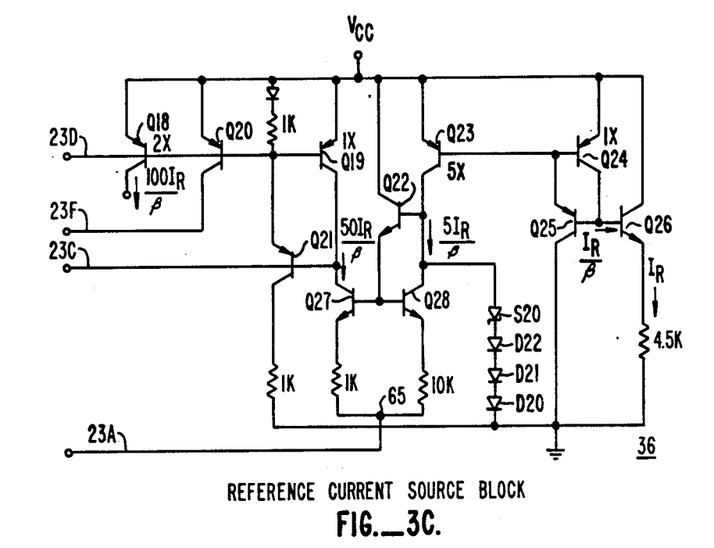
FIG. 3C is a detailed circuit diagram of the reference current source block in the driver section.

FIG. 3C details the circuit of the reference current source block 36 shown in FIG. 3A. The forward-biased base-emitter junctions of the transistors Q24-Q26 create a fixed reference current, $I_R$, through a resistor connected between the emitter terminal of the transistor Q26 and ground. The current flowing through the transistor Q24 is thus $I_R/\beta$. A transistor Q23 is connected as a current mirror to the transistor Q24. Since, the transistor Q23 has a base-emitter junction area which is five times that of the transistor Q24, there is a current of $5I_R/\beta$ from the collector terminal of the transistor Q23. This current flows through a transistor Q28 having its collector terminal connected to the collector terminal of the Q23.

If a node 65 is biased low, then the base-emitter junction of the transistor Q28 is forward-biased and the current from the transistor Q23 flows through the transistor Q28. A transistor Q27, having its base terminal connected to that of the transistor Q28, also has only one-tenth the resistance between its emitter terminal and the node 65 compared to the resistance between the emitter terminal of the transistor Q28 and the node 65. Thus the transistor conducts 10 times the current of the transistor 28.

Control over the current from the transistor Q18 is by a signal from the enable/disable section 13 on a line 23A connected to the node 65. When the signal on the line 23A is high, the transistors Q27, Q28 are no longer properly biased and no current flows through the transistors. Diodes D20-D22 and S20 provide then a shunt path for the constant current from the transistor Q23. No current is generated by the PNP transistor Q18 until the node 65 is again pulled low by the signal on the line 23A.

The multiplied current $50I_R/\beta$ flows through a transistor Q19 on the same current path as the transistor Q27. The current is again multiplied (by two) by the PNP transistor Q18. The transistor Q18 has twice the base-emitter junction area as that of the transistor Q19. The reference current source block 36 thus provides a current of $100I_R/\beta$ from the transistor Q18 when the node 65 is low.

This reference current is multiplied by the current gain $\beta$ of the output transistor Q14 of the driver section 11. Thus the section 11 is a source of current magnitude $100I_R$; the transistor Q14 can supply a current to the output terminal 17 of at least that magnitude. In the embodiment shown, that minimum current is 20 milliamperes. More current can also be supplied to the base of the transistor Q14 by the transistor Q15 to increase the output current. However, this additional current is dependent upon whether the PNP current source transistor Q17 is on or not. As discussed below, various conditions determine whether the transistor Q17 is on or not.

The present invention also is capable of maintaining a high impedance over a common mode range from $-7$ volts to $+12$ volts whether power is off or on.

Common mode ground potential and noise on the output terminals 17, 18 occur with multiple driver circuits connected to the signal lines. High impedance is required in each driver circuit when it is disabled. The present invention provides for such high impedance between the range of $-7$ to $+12$ volts on the output terminals 17, 18. For example, with the line driver circuit disabled, a large positive voltage is met with the reverse-biased Schottky diode S6 (shown in FIG. 4B) or the reverse-biased base-emitter junctions of the NPN transistors Q15 and Q14. Likewise, the reverse-biased base-emitter junctions of the PNP transistors Q18 and Q17 present a large impedance along with the Schottky diode S19. For low voltages at the output terminal 17, the transistors Q15 and Q14 are off; the Schottky diodes S16, S17, S18 and S10 are also reversed biased for a large impedance to that signal.

Even with the line driver circuit turned off and the first voltage supply normally at $V_{CC}$, $+5$ volts, is grounded, the driver circuit still presents a large impedance to postive and negative voltages at the output terminals 17 and 18 in the range between $-7$ to $+12$ volts.

Enable/Disable Section

Figure 4A:
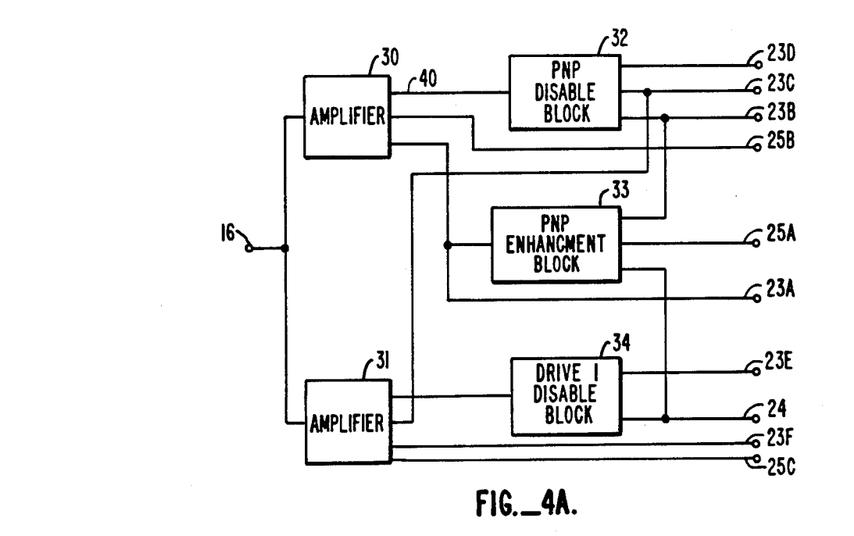
FIG. 4A is general block diagram of the enable/disable section shown in FIG. 1.

The general organization of the enable/disable section 13 is illustrated in FIG. 4A. The section 13 turns off the driver circuits 11, 12 on and off as quickly as possible. To increase the overall data transmission rate of the driver line circuit. A high, or "1" signal, on an enable/disable input terminal 16 turns on the driver circuits 11, 12; a low, or a "0" signal, on the terminal 15 turns off the driver circuits 11, 12. When the line driver circuit is diabled, the line driver circuit presents a high impedance.

The input terminal 16 to the enable/disable section 13 is connected to two amplifiers 30, 31 which generate signals to an PNP disable block 32, PNP enhancement block 33, and driver disable block 34. The PNP disablement block 32 aids in turning off the PNP transistors used as current sources in the driver sections 11, 12. Similarly, the PNP enable block 33, along with the amplifier 31, helps turn on the PNP transistors. These aids are especially important for PNP transistors, which are inherently low switching. The driver disable block 34 hastens the turn-off of the NPN transistors in the driver sections 11, 12.

Specifically, the line 23D from PNP disable block 32 helps turn off the PNP transistors Q18-Q20 of the reference current source block 36 (shown in FIG. 3C). The line 23C from the PNP disable block 32 and amplifier block 31 helps turn the PNP transistor Q21 in the same block 36 off and on. Likewise, the line 23B from PNP disable and enable blocks 32, 33 aids in speeding the PNP transistor Q17 in the driver section 11 (shown in FIG. 3A) off and on, while signals from the amplifier block 30 on the line 23A turn the reference current source block 36 off and on. Line 23E from the driver disable block 34 and line 24 from the block 34 and PNP enable block 33 help turn off the NPN transistors in the driver sections 11, 12.

Figure 4B:
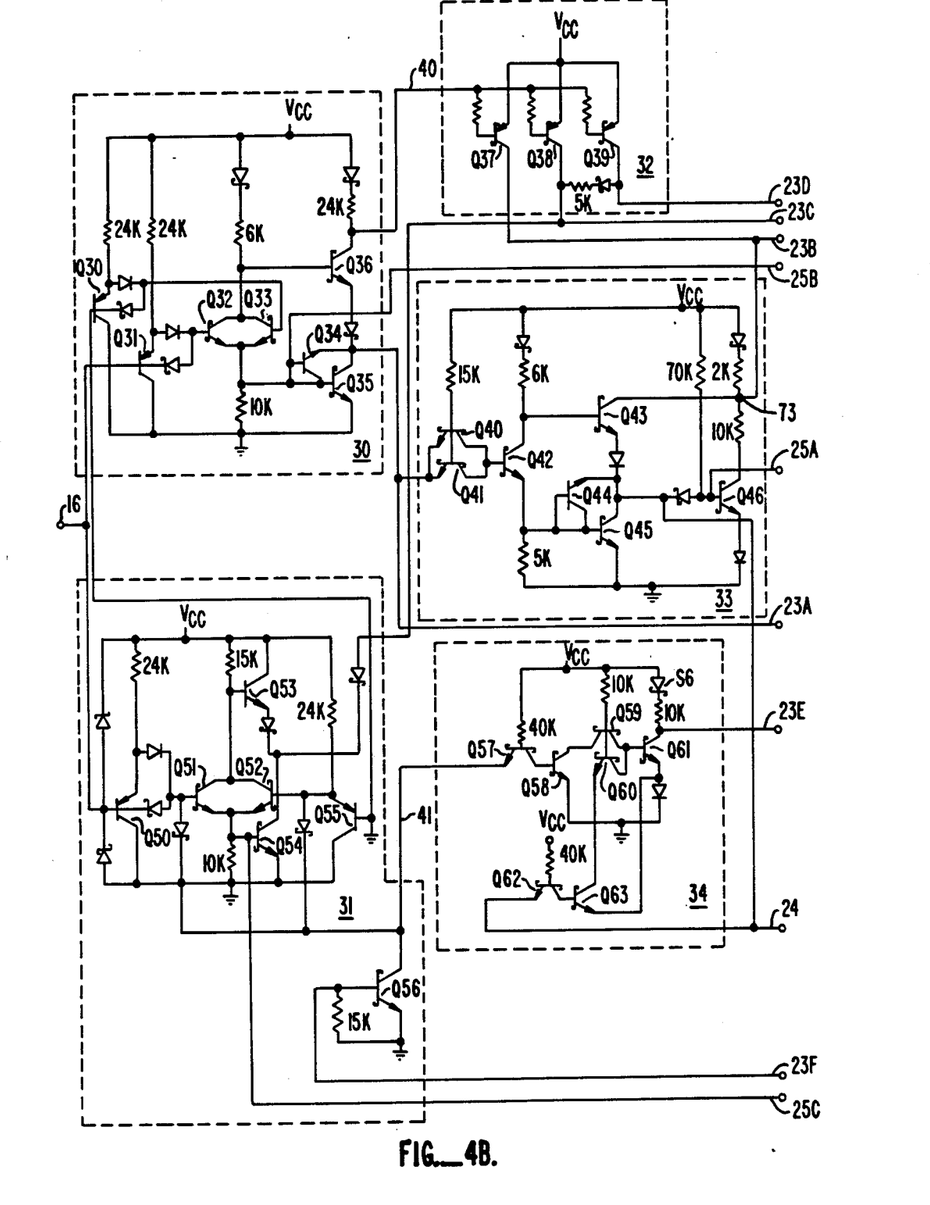
FIG. 4B is a circuit diagram of the various blocks in FIG. 4A.

FIG. 4B shows the detailed circuit diagram of the section 13. The amplifier 30 has two emitter-coupled transistors Q32, Q33. The base of the transistor Q33 is connected through two diodes to an emitter and base terminal, respectively, of a PNP transistor Q30, which has its base connected to ground. When the signal on the input terminal 16 is low, the disable state, the transistor Q32 is turned off. A high, or enable, signal on the terminal 16 turns off an input transistor Q31 and permits the base of the second emitter-coupled transistor Q32 high to be pulled through. The transistor Q32 turns on and the resulting current through the transistor generates a voltage across a 10 kilohm resistor. A transistor Q35, which has its base-emitter junction connected across the resistor, is turned on. At the same time the current through the transistor Q32 lowers the voltage at the base terminal of a transistor Q36. The transistor Q36, having an emitter terminal connected to a collector terminal of the transistor Q35, is cut off.

Similarly, the amplifier 31 has emitter-coupled transistors Q51, Q52, which operate in the same manner. The transistor Q52 has its base terminal connected to an emitter terminal of a transistor Q55 which has its base terminal connected to ground. When the enable/disable signal on the terminal 16 is low, the transistor Q51 is off. A transistor Q54 has no current from the emitter terminal of the transistor Q51 through a resistor connected between the base and emitter terminals of the transistor Q54. It is off. When the signal is high, on the other hand, the transistor Q51 turns on, along with the transistor Q54.

Thus when the input signal to the terminal 16 is low, the transistors Q32 and Q35 in the amplifier block 30 are off. While the transistor Q36 is nominally on, it draws little current since its main current path through the transistor Q35 is blocked. The signal on the line 23A and the node 65 in reference current source block 36 is high. The current source block 36 illustrated in FIG. 3C remains off.

The PNP transistors Q37–Q39 of the PNP disable block 32 are off since their base-emitter junctions are not forward-biased. In particular, with the transistor Q38 off, the signal on the line 23C remains indeterminate. In the PNP enhancement block 33 transistors Q42, Q43 and Q45 remain on; no signal occurs on the line 23B to the PNP current source transistor Q17 of the driver section 11 (shown in FIG. 3A). In the amplifier block 31 the transistors Q51 and Q54 are also off.

PNP Transistor Enhancement

When the signal on the terminal 16 changes from disable to enable, low to high, the transistors Q32, Q35 turn on. Thus, the voltage on the line 23A is low and the node 65 is likewise low. The reference current block 36 is turned on.

Coupled to the transistors Q32, Q35 is the transistor Q42 in the PNP enhancement block 33. The transistor Q42 turns off with the turn-on of the transistor Q35. The transistor Q42 base terminal is pulled low by the current and resulting voltage drop across a 15 kilohm resistor connected between the $V_{CC}$ voltage supply and the base terminals of the now conducting transistors Q40, Q41. With the transistor Q42 off, no current and voltage drop occurs between the base and emitter terminals of a transistor Q45 which has its base terminal connected to the transistor Q42 emitter terminal and to ground through a 5 kilohm resistor. The transistor Q45 is off and the collector terminal of the transistor Q45 is pulled higher and higher by the forward-biased base-emitter junction of the transistor Q43, which has its base terminal connected to the transistor Q42 collector terminal and $V_{CC}$ (through a resistor and Schottky diode).

A transistor Q44 having its collector and bae electrodes connected to the base terminal of the transistor Q45 and its emitter terminal connected to the collector terminal of the same transistor to operate as a capacitor. This transistor Q44 feeds stored charge back as current into the base terminal of the transistor Q45 and the transient current is multiplied by the current gain of the transistor Q45. Temporarily the transistor Q45 turns on and a large current surge passes through the transistor Q43 and the signal line 23B, which is connected to the base terminal of the PNP transistor Q17 in the driver sections 11, 12. The current surge helps turn on the PNP transistor Q17; the larger the current surge the faster the PNP transistor turns on.

At the same time, the enable signal on the terminal 16 turns on the transistors Q51 and Q54 in the amplifier 31. The voltage on the line 23C is lowered and current is drawn through the line 23C from the base region of the PNP transistor Q21 (FIG. 3C). This current through the transistor Q21 turns on the PNP transistors Q18–Q20 and the reference current supply is fully turned on.

This large base current overdrive from the transistor Q54 in the amplifier 31 is turned off after a while by the transistor Q20, which is also initially turned on by the current generated by the transistor Q54. The current from the collector terminal of the transistor Q20 is fed back on the line 23F to the base terminal of a transistor Q56 in the amplifier section 31. The transistor Q56 turns on. Through two Schottky diodes the base terminals of the emitter-coupled transistors Q51 and Q52 are then pulled low to turn off the transistors. Without current across the 10 kilohm resistor between the base terminal and ground, the transistor Q54 is turned off. The current overdrive to the transistor Q21 ends.

However, with the node 65 low all the transistors in the reference current source block 36 remain on. The transistors remain in that state until a disable signal is placed on the input terminal 16.

It should be noted that this technique for providing an initial current surge to turn on a transistor rapidly differs from the capacitor feedback technique previously described. A large current overdrive must force the transistor Q21 on, as well as the transistors Q18–Q20. The present technique of generating the current overdrive by a transistor which is first switched on and then switched off as soon as the PNP transistors are turned on, is more suitable than the more limited current overdrive from the capacitor feedback technique.

PNP Transistor Disablement

The disable signal occurs when the voltage on the terminal 16 goes from high to low. In the amplifier 30 the transistors Q32 and Q35 turn off. As the transistor Q35 turns off, its collector terminal is pulled higher and higher by the forward-biased base-emitter junction of the transistor Q36. A transistor Q34, having its collector terminal connected to the base terminal of the transistor Q35 and its base and emitter electrodes connected to the transistor Q35 collector terminal acts like a capacitor and dumps its stored charge into the base region of the transistor Q35. This momentarily turns on the transistor Q35; a current is drawn through the transistor Q36 and from the base regions of the transistors Q37–Q39 of the block 32 to turn them on.

The PNP transistor Q39 provides a momentary current spike into the base regions of the PNP transistors Q18, Q20 of the reference current block 36 through the line 23D. The PNP transistor Q21 is also turned off by the current spike to the base region thereof through the line 23C from the transistor Q38. A current spike is also provided from the transistor Q37 to the base region of the transistor Q17 for a fast switch-off through the line 23B.

NPN Transistor Disablement

The enable/disable section 13 also provides for a fast switch-off of the NPN transistors of the driver sections 11, 12 when the section 13 is disabled. As shown in FIGS. 3A and 4B, the base regions of the NPN transistors Q14–Q16 of the driver section 11 are connected to the section 13 by a line 23E. When a disable signal appears on the terminal 16, the transistors Q32 and Q35 in the amplifier block 30 are turned off and the node 65 in the block 36 rises. In turn, the PNP transistors Q18–Q21 turn off and the feedback current on the line 23F is shut off. The transistor Q56 in the amplifier 31 turns off. In the NPN disable block 34 the transistor Q58 is thus turned on by the high voltage from the $V_{CC}$ voltage supply on the transistor's base terminal. Current thus flows from the $V_{CC}$/voltage supply through a 10 kilohm resistor, the base region of a transistor Q59 to the transistor Q58 collector terminal. The voltage across the resistor and base-emitter junction of the transistor Q59 cuts off the transistor Q61. The line 23E is then coupled to the voltage supply.

However, before the slower-switching PNP transistors Q18–Q21 are turned off and the current to the transistor Q56 ends, the amplifier block 30, PNP enhancement block 33 and NPN disablement block 34 cooperate to drive the voltage on the line 23E low and to pull current away from base regions of NPN transistors Q14–Q16 through Schottky diodes S16–S18.

When the enable/disable section 13 is disabled, the transistors Q32 and Q37 in the amplifier block 30 are turned off. The emitter terminal of the transistors Q40, Q41 rise in voltage. The base terminal of the transistor Q42 goes high and the transistor Q42, along with the transistor Q45, is turned on. This effectively clamps the line 24, which is connected to the collector terminal of the transistor Q45, to ground.

In the NPN disablement block 34 the base-emitter junction of the transistor Q62 is now biased on, forcing the voltage on the base terminal of the transistor Q63 low. The transistor Q63 turns off. With the turn-off of the transistor Q63, which through the transistor Q60, had been effectively clamping together the voltages on the base and emitter terminals of the transistor Q61, that transistor is permitted to turn on. Thus the line 23E, connected to the collector of the transistor Q61, is pulled low.

Another result of the line 24 being driven low by the action of the transistor Q45 in the PNP enhancement block 33 is that other NPN transistors in the driver section 11 (and 12) are also turned off quickly. The line 24 is connected to the collector electrodes of the emitter-coupled transistors Q2, Q3 in the differential amplifier section 10 shown in FIG. 2. When the voltage on the line 24 is driven low (through Schottky diode S2), the base region of the transistor Q7 is also driven low. The transistor Q7 is now off, whatever the logic state on the input date terminal 15. Through the lines 21A, 21B the base regions of the transistors Q10, Q11 are coupled to ground and with no current through the transistor Q10, the base region of the second output transistor Q12 is also effectively coupled to ground. These NPN transistors are switched off.

Current Limiter Section

Figure 5A:
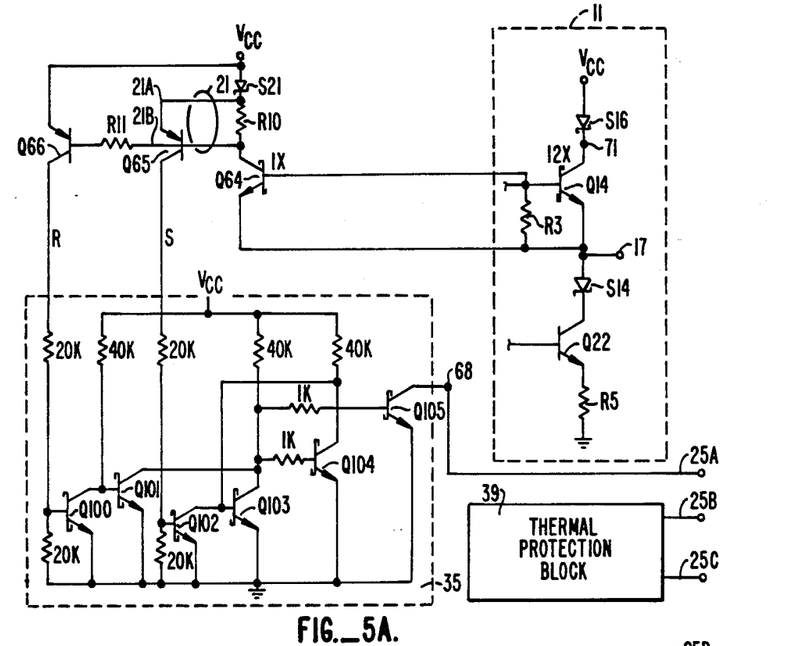
FIG. 5A is a circuit diagram of the circuit limiter section shown in FIG. 1.

To prevent the driver circuits 11, 12 from overheating, a current limiter section 14 is provided. The details of a preferred design of the section 14 are shown in FIG. 5A. Current is limited in two ways. First, the section 14 limits the current from the driver sections 11, 12 when the common mode voltages on the signal lines draw excessive current from the circuit. Secondly, the section 14 turns off the current through the driver sections 11, 12 completely when the temperature of the circuit exceeds a predetermined operating temperature.

In FIG. 5A part of the driver section 11 is drawn to better indicate the connection between the driver section 11 (and 12) and the current limiter section 14. The driver sections 11, 12 are connected together in parallel at a node 71 to the collector terminal of the output transistor Q14. In other words, the collector terminal of the corresponding output transistor of the second driver section 12 is connected to the node 71 and the two sections share the Schottky diode 16.

Each section 11, 12, though, has its own mirroring transistor Q64, sensing transistors Q65, Q66, and set-reset latch 35. The output terminals of the two latches 35 are connected together at a node 68 which is connected to the line 25A. The line 25A is connected to the base terminal of the transistor Q46 in the PNP enhancement block 33 of FIG. 4B. When engaged, any one of the latches 35 can pull the line 25A low, turning off the transistor Q46. The transistor Q46 is normally on when the overall line driver circuit is on; i.e., the signal on the terminal 16 is high. With the transistor Q46 switched off, the voltage supply $V_{CC}$ pulls the collector terminal of that transistor Q46 high together with a node 73 connected to the line 23B.

As shown in FIG. 3A, the line 23B is connected to the base terminal of the PNP current source transistor Q17. The high voltage on the base region of the transistor Q17 turns off that transistor. The only current available to drive the output transistor Q14 in the current driver sections 11, 12 is from the reference current block 36.

The mirroring transistor Q64 in current limiter section 14 shown in FIG. 5A has its base and emitter terminals respectively connected directly to the base and emitter terminals of the output transistor Q14. The current through the output transistor Q14 is "mirrored" by the transistor Q64, though at one-twelfth the magnitude due to the size differences of the transistors. The current through the transistor Q14 (via the mirroring transistor Q64) is monitored by a pair of PNP sensing transistors Q65, Q66. The transistor Q66 has an emitter terminal connected to the voltage supply $V_{CC}$, its base terminal is connected through a resistor R11 to the base terminal of the transistor Q65. The emitter of the transistor Q66 is connected to the $V_{CC}$ voltage supply through a Schottky diode S21; the base terminal of the transistor Q65 is connected to the collector terminal of the mirroring transistor Q64. A resistor R10 connects the diode S21 to the collector terminal of the transistor Q64.

The transistor Q65 senses the amount of current through the output transistor Q14 by the current through the resistor R10. More current through the transistor Q14 generates more current through the resistor R10. The base-emitter junction of the transistor Q65 is forward-biased in direct proportion to the amount of current through the resistor R10. This, in turn, provides more current out through the collector terminal of the transistor Q65. This current provides a set signal for the set-reset latch 35 enclosed by a dotted line in 35.

The transistor Q66 provides the reset signal to the latch 35. Like the transistor Q65, the transistor Q66 generates current from its collector terminal in direct proportion to the amount of current through the resistor R10.

The set-reset latch 35 shown in FIG. 5A has six NPN transistors Q100–Q105, each having its emitter terminal directly connected to ground. Connected by its base terminal to the collector terminal of the transistor Q66, the transistor Q100 has its collector terminal to the voltage supply $V_{CC}$ through a resistor and to the base terminal of the transistor Q101. The collector terminal of the transistor Q101 is connected to the collector terminal of the transistor Q103. That terminal is also connected to the voltage supply by 40 kilohm resistor. Through another resistor of one kilohm the collector terminal of the transistor Q103 is connected to the base terminal of the transistor Q104, which also has its collector terminal connected to the voltage supply through a 40 kilohm resistor. In a similar fashion, the transistor Q103 collector terminal is connected to the base terminal of the transistor Q105 through a one kilohm resistor. The transistor Q105 collector terminal is connected to the line 25A.

The collector terminal of the sensing transistor Q65 is connected to the base terminal of the transistor Q102 through a resistor; the transistor Q102 collector terminal is further connected to the base terminal of the transistor Q103. The base terminal of the transistor Q103 is also connected to the transistor Q104 collector terminal by a feedback path.

At the start of each cycle of data transmission, no current flows through the output transistor Q14 and the sensing transistors Q65, Q66. The transistor Q100 in the latch 35 is therefore off, allowing the voltage on the transistor Q101 base terminal to be pulled high. The transistor Q101 is on. This pulls the base region of the transistor Q104 low to turn off the transistor Q104 and the transistor Q104 collector terminal is pulled high. By the fedback path to the base region of the transistor A103, that transistor is turned on. With no current from the sensing transistor Q65, the transistor Q102 is also off. The circuit described is now latched and the voltage upon the base terminal to the transistor Q105 is low. The transistor Q105 is off and the node 68 is not coupled to ground.

Even as current begins to flow from the sensing transistor Q66 to turn on the transistor Q100 and turn off the transistor Q101, the state of the transistors Q103–Q105 remain unchanged. These transistors remain latched until the magnitude of the current through the output transistor Q14 in the driver section 11, 12 causes enough current to be generated by the sensing transistor Q65, since that transistor's base-emitter junction is biased by the voltage across the resistor R10. At a predetermined point, the transistor Q102 is turned on. With the transistor Q102 on, the transistor Q103 is turned off, turning on the transistor Q104. The transistor Q105 is also turned on as the voltage on the base terminal of the transistor is pulled high by the voltage supply. The node 68 and the line 25A is now pulled low; the latch 35 is set. The PNP transistor Q17 in driver sections 11, 12 is turned off.

The sensing transistor Q66 generates the current for the reset signal. Since its base-emitter junction is biased by both the Schottky diode S21 and the resistor 10, the transistor Q66 normally supplies current to keep the transistor Q100 on. The sensing transistor Q66 generates a reset signal when the transistor is turned off and no current is supplied to the transistor Q100. This occurs at each data transition point when the data signal at the input terminal 15 (FIG. 2) switches logic states. For example, if the signal at the terminal 15 causes a "1" or high signal from the driver section 11, the transistor Q66 is on. When the signal at the terminal 15 switches, the transistor Q66 turns off as the driver 11 generates a "0" or low signal. It should be noted, however, that if the condition which caused the heavy current to be drawn from the driver section 11 also draws heavy current from the complementary driver section 12, the set-reset latch of that section 12 causes its PNP current source transistor Q17 to turn off also. The current is still limited.

Besides protection against excessive output current, the present invention has protection against excessive temperature by a thermal protection block 39. The thermal protection block 39 shuts down the driver sections 11, 12 when the driver circuit gets too hot. The block 39 sends signals on lines 25B, 25C, part of the signal path 25, to the enable/disable section 13 to turn off (disable) the driver sections 11, 12.

Figure 5B:
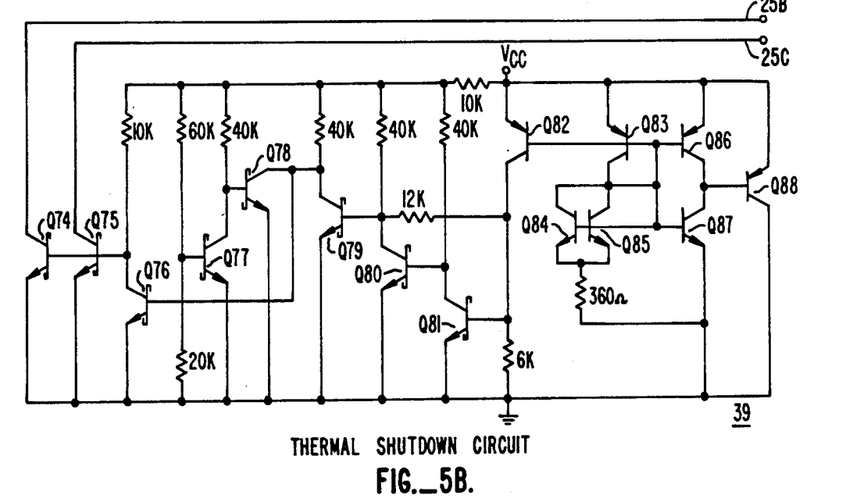
FIG. 5B details the thermal shutdown block shown in FIG. 5A.

The details of the block 39 are shown in FIG. 5B. In the block 39 a pair of transistors Q84, Q85 are arranged with respect to a transistor Q87 to provide a current proportional to the temperature in a well-known circuit arrangement. The current through the parallel and diode-connected transistors Q84, Q85 is drawn through a PNP transistor Q83. The same amount of current is drawn through a transistor Q82 in current mirror fashion. Schottky transistors Q79–Q81 form a latch, really a hysteresis amplifier, responsive to the current through the transistor Q82. In normal operation, transistors Q74, Q75 and Q76 turn off and on according to the state of the transistors Q79–Q81.

The transistors Q79–Q81 become latched when the current through the sensing transistors Q84, Q85 exceed a predetermined magnitude. At this point the current from the transistor Q82 is sufficient to forward-bias the base-emitter junction of the transistor Q81. With the transistor Q81 on, the transistor Q80 is off and the transistor Q79 is on. The transistor Q76 having its base terminal connected to the transistor Q79 collector terminal, therefore turns off since its base terminal is pulled low. In contrast, the two parallel-connected transistors Q74, Q75 have their base terminals pulled high and the transistors turn on. With the collector terminals of the transistors Q74, Q75 respectively connected to the signal lines 25B, 25C, the voltages on the lines 25B, 25C are low.

From FIG. 4B, it can be seen that the lines 25B, 25C are respectively connected to the base terminals of the transistor Q35 in the amplifier block 30 and of the transistor Q54 in the amplifier block 31. When the thermal protection block 39 pulls those lines 25B, 25C low in response to excessive temperature, both transistors Q35 and Q54 are cut off. The line 23A thus goes high turning off current from the PNP current source transistor Q18 of the current source block 36 shown in FIG. 3A and detailed in FIG. 3C. The line 23B also goes high since the transistor Q46 in the PNP enablement block 33 is turned off. Consequently, the PNP current source transistor Q17 of the driver section 11, 12 is also turned off. The driver sections 11, 12 are disabled; only a large impedance appears across the output terminals 17, 18.

Transistors Q77, Q78 through the thermal protection block 39 keep the driver sections 11, 12 disabled during the transient state when power is turned on. As $V_{CC}$ rises to its +5 volts, the transistor Q77 base terminal is kept low by two resistors of 20 and 60 kilohms, acting as a voltage divider. With the transistor Q77 off, no current flows through a 40 kilohm resistor connected between the transistor's collector terminal and the voltage supply. The base terminal of the transistor Q78 connected to the transistor Q77 collector terminal is pulled high and the transistor Q78 is turned on. In turn, the transistor Q78 has its collector terminal connected to the transistor Q76 base terminal. The transistor Q76 base terminal is thus pulled low by the turned-on transistor Q78. With the transistor Q76 off, the $V_{CC}$ voltage supply pulls the base terminals of the transistors Q74, Q75 high through a 10 kilohm resistor. The transistors Q74, Q75 turn on and the lines 25B, 25C are pulled low to disable the driver circuits 11, 12 as explained previously.

As $V_{CC}$ stabilizes and returns fully to +5 volts, the voltage on the base terminal of the tranistor Q77 rises sufficiently to turn on the transistor. The transistor Q78 is turned off, the transistor Q76 on and so forth. The result is that the lines 25B, 25C are freed from the action of the transistors Q77, Q78. The rest of the circuit can operate without interference.

While the thermal protection block 39 could be used to shutdown only one of the PNP current source transistors; i.e., the transistor Q17, the embodiment here shuts down all the current through the driver sections 11, 12. This is very useful when more than one driver circuit is incorporated on an integrated circuit. When the currents through the multiple driver circuits (with corresponding driver sections 11, 12) heat the integrated circuit excessively, the complete shutdown of all the driver circuits by a thermal protection block 39 connected to the enable/disable sections 13 of each of the driver circuits better insures the protection of the integrated circuit from damaging heat.

Previous thermal protection designs have had the problem of oscillation. When shutdown occurs and less power is dissipated, the circuit cools as desired. The shutdown circuit is then disengaged and the circuit heats up. Again shutdown occurs and so forth.

The thermal protection block 39 of the present invention avoids oscillation. The transistor Q79 has its base region connected to the transistor Q80 collector terminal, which is also connected to the base terminal of the transistor Q79. This feedback arrangement creates a hysteresis effect; the transistor Q81 stays on even after the current from the transistor Q82 drops below the level which originally turned the transistor Q81 on. The transistors Q79–Q81 stay latched until the current from the transistor Q82 is so low that the transistor Q81 cannot remain on. At this point the temperature sensed by the transistors Q84–Q85 is far low the triggering temperature and oscillation is prevented.

Likewise, oscillation in the previously described current limiter circuit with set-reset latch 35 and sensing transistors Q65, Q66 is avoided. Even though the current through the output transistor Q14 may fluctuate, current is limited until the latch 35 is reset at the data transition point (or the circuit is disabled).

Figure 6A:
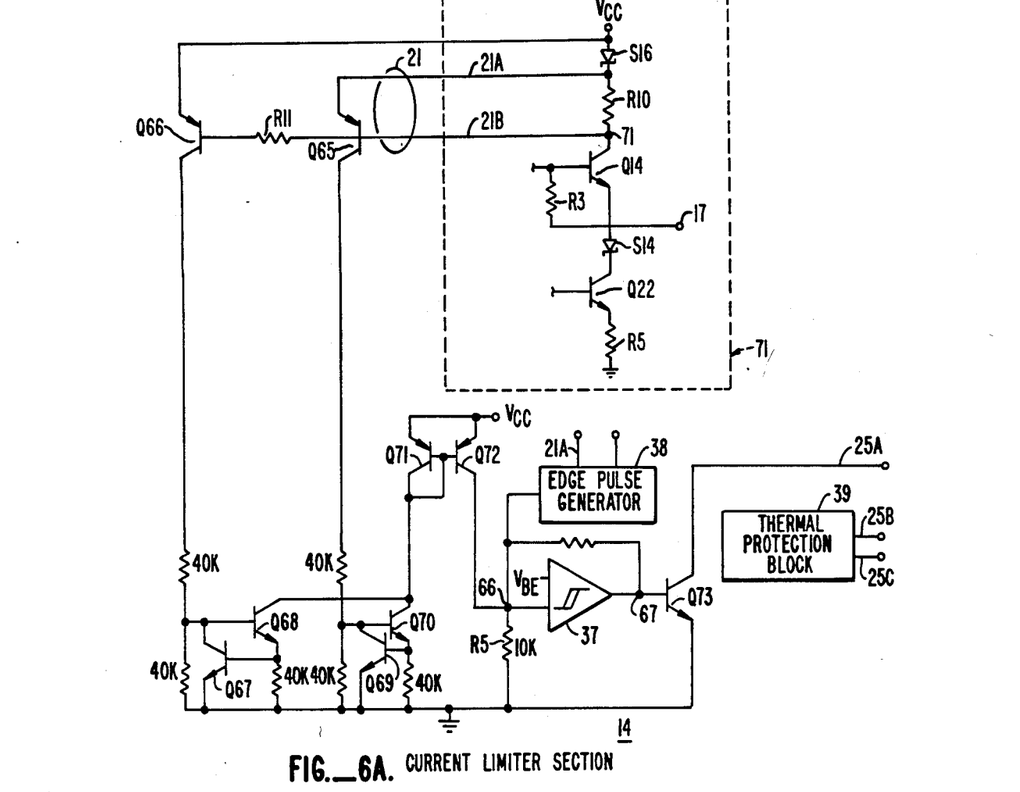
FIG. 6A is a circuit diagram of an alternative current limiter section shown in FIG. 1.

An alternative current limiter section 14 is shown in FIG. 6A. Where an element of the circuit performs the same function as in the drawing of FIG. 5A, the same reference numeral has been retained.

For the alternative current limiter section, the current in the driver section 11 (and 12) is directly monitored. The resistor R10 is directly in the path of the current through the output transistor Q14 between the Schottky diode S16 and the node 71. The mirroring transistor Q64 of FIG. 5A is not needed and the sensing transistors Q65, Q66 have their base-emitter junctions connected across the resistor R10, and the resistor R10 and diode S16, respectively.

It should be noted that the corresponding output transistor of the complementary driver section 12 is connected in parallel to the output transistor Q14 of the driver section 11, as explained with respect to FIG. 5A. Since the sensing transistors Q65, Q66 monitor the output current through either driver section 11, 12, there is no duplicate circuit as required for the set-reset latch 35 in the first current limiter design.

The alternative current limiter operates in the same manner as explained previously. Increased current through the output transistor Q14 causes an increased voltage across the resistor R10 and voltage difference on the lines 22A, 22B also increases. If the current increase is large enough, both PNP sensing transistors Q65, Q66 are turned on. NPN transistors Q68, Q70 are then respectively turned on and the combined currents through the two transistors pass through a diode-connected transistor Q71. A transistor Q72 is connected to the transistor Q71 in a current mirror fashion so that the same amount of current is drawn through the transistor Q72 as the transistor Q71. The current from the transistor Q72 are connected to a hysteresis amplifier 37 at a node 66. As shown, the amplifier 37 will latch when the input voltage at the node 66 exceeds a reference voltage, $V_{BE}$, the voltage across a forward-biased base-emitter junction of a transistor.

When the both transistors Q65, Q66 are turned on, the current through the node 66 is large enough to create a voltage across a 10 kilohm resistor R5 larger than $V_{BE}$. The amplifier 37 latches on, which then supplies current to the base terminal of a transistor Q73. The amplifier 37 stays latched on unless both sensing transistors are off. The amplifier 37 also unlatches and disengages itself at each negative pulse from an edge pulse generator 38, which is also connected to the input node 66 to the amplifier 37. The generator 38 fires a negative pulse at each transition of the data signal at the input terminal 15.

Once on, the transistor Q73 pulls the voltage on the line 25 low. The voltage on the line 23B thereby goes high to turn off the PNP current source transistor Q17 in the driver sections 11, 12. Less current is available as output current through the transistor Q14 and the current is limited.

The arrangement of requiring the current of two sensing transistors to turn on the hysteresis amplifier 37 and requiring both sensing transistors to unlatch the amplifier 37 avoids the previously described problem of oscillation around a high output current. The output current drawn must fall considerably below the trigger point of the amplifier 37 before the PNP current source transistor Q17 is turned on once more for an increase in output current.

Figure 6B:
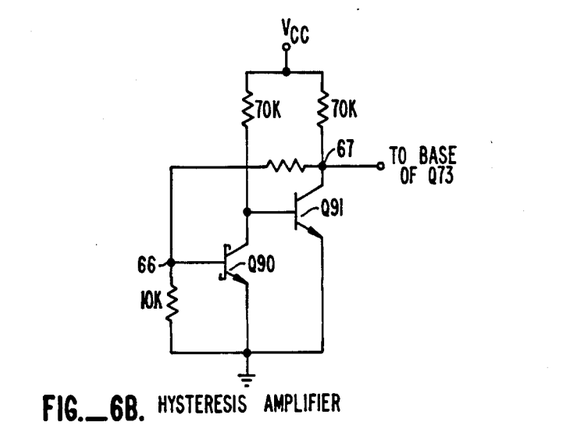
FIG. 6B is a detailed circuit diagram of the hysteresis amplifier shown in FIG. 6A.
Figure 6C:
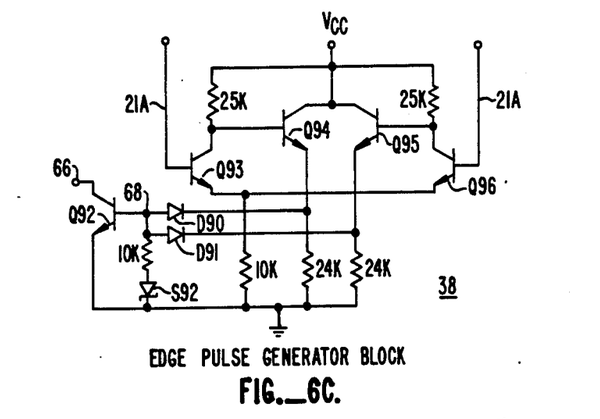
FIG. 6C is a detailed circuit diagram of the edge pulse block shown in FIG. 6A.

The details of the hysteresis amplifier 37 are shown in FIG. 6B. The edge pulse generator 38 releases the amplifier 37 by a negative-going pulse at each rising or falling edge of data input signals. The details of the edge pulse generator are illustrated in FIG. 6C. The hysteresis amplifier 37 can also be released by disabling the driver sections 11, 12; i.e., zero output current releases the latch of the amplifier 37.

The hysteresis amplifier 37 in FIG. 6B has the input node 66 which is connected to a base terminal of a transistor Q90. The transistor Q90 and a transistor Q91 have their emitter terminals connected to ground and their collector terminals to the $V_{CC}$ supply voltage through 20 kilohm resistors. The transistor Q90 collector terminal is also directly connected to the transistor Q91 base terminal and the collector terminal of the transistor Q91 is connected back to the transistor 90 base terminal through a resistor. The amplifier turns on and latches when the input signal at the node 66 is higher than $V_{BE}$. Such a voltage is generated at the base terminal of the transistor Q90 by the combined current from the two sensing transistors Q65, Q66 across a 10 kilohm resistor between the base terminal and ground. The transistor Q90 to turn off the transistor Q91. The voltage at the collector terminal of the transistor 91 (node 67) is high; the transistor Q73 is turned on.

The node 67 is coupled back to the base terminal of the transistor Q90 so that the circuit is now latched. The original input voltage at the node 66 may drop, but the feedback circuit maintains the transistor Q90 base terminal high. The input signal must fall far below $V_{BE}$ before the feedback circuit cannot compensate for the fall of input voltage. Then the transistor Q90 is turned off and the amplifier 37 is unlatched.

FIG. 6C shows the circuit diagram of the edge pulse generator block 38. The base terminals of transistors Q93, Q96 are connected to the lines 21A from each of the driver sections 11, 12. As these sections 11, 12 switch in logic states, the block 38 generates negative-going pulses at the node 66.

Figure 6D:
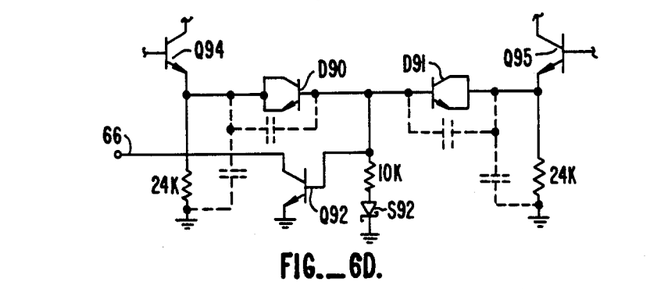
FIG. 6D is a detailed circuit diagram of FIG. 6C illustrating some of the operational feature of the edge pulse block.
Figure 6E:
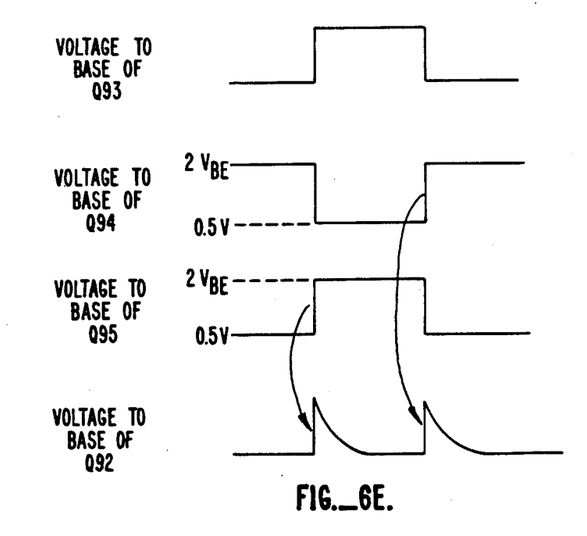
FIG. 6E illustrates the operation of the edge pulse block by the voltage signals at various points of the block of FIG. 6C.

FIG. 6D illustrates the part of operational circuitry of the block 38. Parasitic capacitors which are actively used in the operation of the 38 block, are shown by dotted lines. FIG. 6E shows the voltage signals at various nodes of the circuit. Of course, the positive voltage spikes at the base terminal of the transistor Q92 causes corresponding negative spikes at the node 66 as the transistor Q92 is turned off and on.

It should be noted that the driver sections 11, 12 are also designed so that current is limited should the output terminal 17 be pulled high. As shown in FIG. 3A, the base terminal of the transistor Q11 is decoupled from the effects of voltages changes on the collector terminal by a subcircuit of a transistor Q13, Schottky diode S15 and resistors shown. Thus the second output transistor Q12 pulls a constant output current through the output terminal 17 independent of the high voltage on the terminal 17.

As will be understood by those familiar with the art, the present invention may be embodied in other specific forms without departing from the spirit or essential characteristics thereof. For example, while the techniques for rapidly turning on and off bipolar transistors have been directed toward PNP transistors, it should be clear that the techniques may be applied to NPN transistors. Furthermore, while the techniques herein are described in the application of line driver circuits, these novel circuits may be used in other fields. Finally, the values for various circuit elements, such as resistors, should be understood to be dependent upon the different applications of the various aspects of this invention. Accordingly, the disclosure of the preferred embodiment of the invention is intended to be illustrative, but not limiting, of the scope of the invention which is set forth in the following claims.

What is claimed is:

1. A circuit for turning on at least one PNP transistor at high speed comprising:
   switching means responsive to an input signal for biasing said PNP transistor to turn on said transistor,
   a first transistor having a base terminal coupled to said switching means such that said first transistor turns off when said switching means turns said PNP transistor on, a collector terminal coupled to a first voltage supply through a further switching means and a base region of said PNP transistor, and an emitter terminal coupled to a second voltage supply, and
   capacitive means connected between said base and collector terminals of said first transistor,
   whereby said capacitive means turns said first transistor momentarily on when said switching means turns on said PNP transistor to create a current surge from said base region of said PNP transistor.

2. The circuit as in claim 1 wherein said further switching means comprises:
   a second transistor having a base terminal coupled to said switching means so that said second transistor turns off when said PNP transistor is turned on, a collector terminal coupled to said first voltage supply, and an emitter terminal coupled to said second voltage supply,
   a third transistor having a base terminal connected to said collector terminal of said second transistor, a collector terminal connected to a base terminal of said PNP transistor, and an emitter terminal, and
   said first transistor having said base terminal connected to said emitter terminal of said second transistor, said emitter terminal connected to a said second voltage supply, and said collector terminal connected to said emitter terminal of said third transistor.

3. The circuit as in claim 2 wherein said capacitive means comprises a fourth transistor having an emitter terminal forming a first terminal of said capacitive means and having a base and a collector terminal forming a second terminal of said capacitive means.

4. The circuit as in claim 2 wherein said collector terminal of said second transistor is connected to said first voltage source by an impedance means and a first current rectifying means.

5. The circuit as in claim 2 wherein said collector terminal of said first transistor is connected by said emitter terminal of said third transistor by a second rectifying means.

6. The circuit as in claim 2 wherein said first, second and third transistors comprise NPN transistors.

7. A circuit for turning on at least one PNP transistor at high speed comprising:
   switching means for biasing said PNP transistor to turn on said transistor,
   a first transistor having a base terminal coupled to said switching means, a collector terminal coupled to a first voltage supply through a bias means, said collector terminal also coupled to a base region of said PNP transistor and an emitter terminal coupled to a second voltage supply so that responsive to said switching means said first transistor drives current from said base region of said PNP transistor when said switching means turns on said PNP transistor, and
   means coupled to said PNP transistor and to said first transistor for turning off first transistor after the PNP transistor is turned on,
   whereby said PNP transistor is turned on by a temporary current surge from said base region of said PNP transistor base region after said switching means first turns on said PNP transistor.

8. The circuit as in claim 7 wherein said turning off means comprises:
   a second transistor having a base terminal coupled to a collector terminal of said PNP transistor, an emitter terminal coupled to said second voltage supply, and collector terminal connected to said switching means so that said switching means stops said first transistor from driving current from said PNP transistor base region.

9. The circuit as in claim 8 wherein said bias means comprises a third transistor having a base terminal connected to said first voltage supply, a collector terminal connected to said first voltage supply, and an emitter terminal coupled to said collector terminal of said first transistor.

10. The circuit as in claim 9 further comprising a first rectifying means between said collector terminal of said first transistor and said emitter terminal of said third transistor.

11. The circuit as in claim 10 further comprising a second rectifying means connected between said collector terminal of said first transistor and said base region of said PNP transistor.

12. The circuit as in claim 7 wherein said first and second transistors comprise NPN transistors.

13. The circuit as in claim 12 wherein said second transistor collector terminal is connected to said switching means so that said switching means turns said first transistor off after said PNP is turned on, said switching means continuing to bias said PNP transistor on.

14. A circuit for turning off at least one PNP transistor at high speed comprising:
switching means responsive to an input signal for biasing said PNP transistor on and for unbiasing said PNP transistor off,
a first transistor having a base terminal coupled to said switching means such that said first transistor turns off when said switching means turns said PNP transistor off, a collector terminal coupled to a first voltage supply through a further switching means, and an emitter terminal coupled to a second voltage supply,
a second transistor having a base terminal coupled to said first transistor collector terminal, an emitter terminal coupled to said first voltage supply, and a collector terminal coupled to a base region of said PNP transistor, and
capacitive means connected between said base and collector terminals of said first transistor, said capacitive means turning said first transistor momentarily on when said switching means unbiases said PNP transistor, said first transistor momentarily turning said second transistor on,
whereby said second transistor generates a current to said base region of said PNP transistor.

15. A circuit as in claim 14 wherein said further switching means comprises a third transistor having a base terminal coupled to said switching means, an emitter terminal coupled to said first transistor collector terminal and a collector terminal coupled to said first voltage supply and to said base terminal of said second transistor.

16. A circuit as in claim 15 wherein said capacitive means comprises a fourth transistor having an emitter terminal forming a first terminal of said capacitive means and having a base and a collector terminal forming a second terminal of said capacitive means.

17. The circuit as in claim 14 wherein said first transistor is an NPN transistor and said second transistor is a PNP transistor.

* * * * *